United States Patent [19]
Jacoby

[11] Patent Number: 5,224,538
[45] Date of Patent: Jul. 6, 1993

[54] DIMPLED HEAT TRANSFER SURFACE AND METHOD OF MAKING SAME

[76] Inventor: John H. Jacoby, Jackson Pond Rd., New Hampton, N.H. 03256

[21] Appl. No.: 786,275

[22] Filed: Nov. 1, 1991

[51] Int. Cl.⁵ .............................................. F28F 3/08
[52] U.S. Cl. ..................................... 165/166; 165/185
[58] Field of Search ................................ 165/166, 185

[56] References Cited

U.S. PATENT DOCUMENTS

| | | | |
|---|---|---|---|
| 2,935,664 | 5/1960 | Schärli | 165/185 X |
| 3,664,928 | 5/1972 | Roberts | 202/236 |
| 4,043,388 | 8/1977 | Zebuhr | 165/166 |
| 4,858,685 | 8/1989 | Szücs et al. | 165/166 |

Primary Examiner—Allen J. Flanigan
Attorney, Agent, or Firm—Robert J. Doherty

[57] ABSTRACT

A dimpled heat transfer surface for transferring heat energy from either a hot fluid or hot object to a cooler fluid, and method of making same. The heat transfer surface includes at least one plate for transferring heat energy from the hot fluid on one side of the plate to the cool fluid on the other side of the plate, and a plurality of intact spaced depression on one side of the plate thereby creating a plurality of intact projections on the other side of the plate. The depressions and projections are arranged to increase both the heat transfer film coefficient of the plate and the heat energy being transferred by the plate.

6 Claims, 3 Drawing Sheets

DIMPLED HEAT TRANSFER SURFACE AND METHOD OF MAKING SAME

FIELD OF INVENTION

This invention relates to heat transfer surfaces and a method for making them. The heat transfer surface has a plurality or projections to increase both the film coefficient and heat transfer capability of the surface. This invention further relates to improved heat dissipators including heat sinks and heat exchangers which use such a heat transfer surface.

BACKGROUND OF INVENTION

Heat transfer surfaces are the surfaces through which heat energy passes from one object or fluid to another. The prime heat transfer surface of heat exchangers, such as an air-to-air heat exchanger, transfers the heat energy from a hot fluid to a cool fluid both of which are flowing through the heat exchanger. Also, because mixing of hot and cool fluids is not generally permitted, the transfer surface also functions as the pressure boundary between the fluids. One way of dissipating heat energy from a hot object to a cooling medium is by affixing a number of fin like structures directly to the object or to a heat sink affixed to the object; the fins transfer the heat energy to the cooling medium.

A simple heat transfer surface is a smooth, flat surface. Such a surface, however, does not transfer heat energy as readily as do other non-planar surfaces, such as plates with protruding pins, wavy-fin plates and louvred plates. The best of these is the plate with protruding pins. However, the manufacturing of these plates is difficult, time consuming and expensive.

These protruding pin heat transfer surfaces have been made in accordance with the methods disclosed in U.S. Pat. Nos. 3,327,779 and 3,399,444. These methods, however, involve a number of manufacturing steps, typically including fixing a plurality of U-shaped wires to the surface of the hot object or a plate affixed to the object. These heat transfer surfaces have been also been made by casting, or by sawing away the metal block material to create the projections. In the machining method the pins are not optimal for heat transfer because of their square or hexagonal cross-sectional shape.

Protruding pin heat transfer surfaces have been used in compressor aftercoolers and/or intercoolers, where the cooling fluid was water, and in hydraulic system heat exchangers where the cooling fluid was air or water. In these applications solid pins were affixed to the surface of a pipe or tube being used as the prime heat transfer surface and pressure boundary.

Since these transfer surfaces are difficult, time consuming and expensive to manufacture, they have been generally used only when optimization of heat transfer is more important than cost considerations. In other situations, were space limitations do not require optimization of heat transfer, less expensive heat transfer surfaces are typically used.

SUMMARY OF INVENTION

It is therefore an object of this invention to provide an inexpensive, easy-to-manufacture heat transfer surface having an increased film coefficient and heat transfer coefficient.

It is a further object of this invention to provide an improved heat exchanger which will be smaller and require less material than a flat plate heat exchanger of an equivalent heat transfer capability.

It is a further object of this invention to provide an improved heat exchanger where heat transfer capability can be increased with little impact on the cost and materials used to make the heat exchanger.

It is a further object of this invention to provide an improved heat dissipator which will be smaller and require less material than a flat plate heat dissipator.

This invention results from the realization that a heat transfer surface which exhibits the heat transfer characteristic of a pinned surface can be achieved by integrally forming in one side of the plate a plurality of intact spaced depressions, thereby creating a plurality of intact projections on the other side of the plate. These depressions and projections create the increased film coefficient and heat transfer capability of the plate surfaces.

This invention features an improved heat dissipator for transferring heat energy from a hot object to a cooling fluid with at least one plate for transferring the heat energy, and a plurality of intact spaced depressions on one side of the plate thereby creating a plurality of intact projections on the other side of the plate, the depressions and projections being aligned to increase both the heat transfer film coefficient of the plate and heat energy being transferred by the plate.

This invention also features a heat exchanger, for transferring heat energy from a hot fluid to a cool fluid, with at least one plate for transferring the heat energy from the hot fluid on one side of the plate to the cool fluid on the other side of the plate, and a plurality of intact spaced depression on one side of the plate thereby creating a plurality of intact projections on the other side of the plate, the depressions and projections also being arranged to increase both the heat transfer film coefficient of the plate and the heat energy being transferred by the plate. The improved heat exchanger may have a plurality of plates for transferring energy from the hot fluid to the cool fluid.

The pattern of projections may be a plurality of spaced in-line rows and columns, or alternating rows and columns. The vertical surfaces of the projections may be at right angles to the plate. The surfaces of the plates between the projections and depressions may be flat. The improved heat exchanger may further include means for housing the plates and for creating passages for the hot and cool fluids so that the hot fluid can flow along one surface of the plates and the cool fluid along the other surface. The heat dissipator may include means for flowing the cooling fluid along the surfaces of the plates having projections.

This invention also features a method for making a heat transfer surface having a plurality of projections so that the surface with these projections will have an increased heat transfer film coefficient and heat transfer capability. A metal plate is located between confronting dies so that when the dies are pressed together a plurality of intact projections and corresponding intact depressions are formed integrally in the metal plate. Provided on the face of one confronting die are a plurality of raised regions which correspond to the alignment of the projections. The confronting die is provided with a plurality of depressions aligned with the raised regions of the other die. The projections and depressions formed in the plate conform to the alignment of the projections for increasing the heat transfer capability and heat transfer film coefficient of the heat transfer surface.

Preferably, the raised regions on one of the confronting die surfaces are aligned in a plurality of spaced alternating rows and columns. Alternatively, the raised regions may be aligned in a plurality of spaced in-line rows and columns. The height and width of the raised regions may be selected so that the vertical surfaces of the projections formed in the plate would be at right angles to the plate. The depressions may also correspond to the alignment of the projections so that both surfaces of the plate are controlled during the formation of depressions and projections.

DISCLOSURE OF PREFERRED EMBODIMENT

Other objects, features and advantages will occur to those skilled in the art from the following description of a preferred embodiment and the accompanying drawings, in which:

FIG. 4b is an axonometric view of a cross-section of a heat transfer section according to this invention for use within the air-to-air heat exchanger of FIG. 4a;

Figure 1:
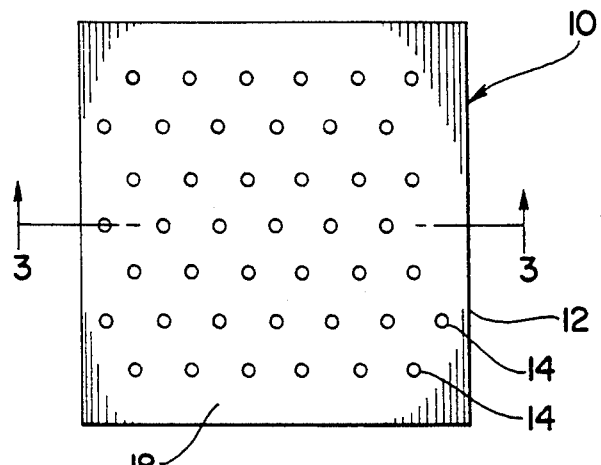
FIG. 1 is a plan view of a heat transfer surface according to this invention having alternating rows and columns of dimples.
Figure 2:
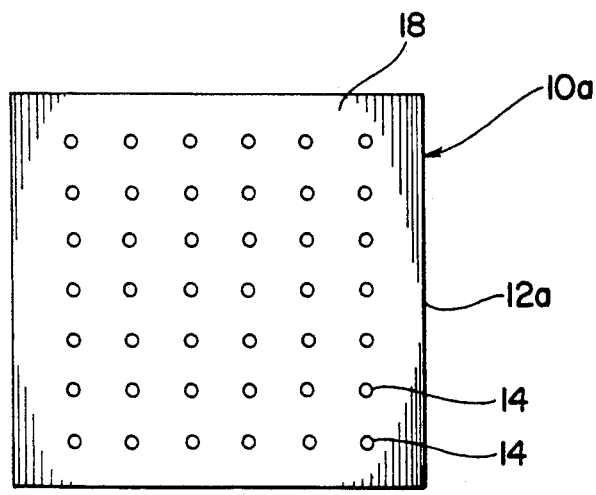
FIG. 2 is a plan view of a heat transfer surface according to this invention having in-line rows and columns of dimples.

There is shown in FIG. 1 a plan view of heat transfer surface 10 according to this invention having alternating rows and columns of dimples 14 on flat plate surface 12. While more clearly seen in FIG. 3, the area between dimples 14, regions 18, is substantially flat. Alternatively, as shown in FIG. 2, heat transfer surface 10a may have in-line rows and column of dimples 14. Regions 18 are considered to be substantially flat because it is possible for region 18 to become distorted during the forming process such that the surface is no longer perfectly planar. In addition, while in the preferred embodiments regions 18 are substantially flat this is not a limitation. Using known techniques regions 18 may be provided with a surface irregularity to improve the heat transfer capability of the dimpled heat transfer surface.

The alignment of the rows and columns can affect both the heat transfer capability of the surface and the pressure drop of a fluid flowing across the surface. For example, when all other parameters and conditions are equal, the heat transfer capability of a plate with alternating rows would be on the order of 25% greater than a plate with in-line rows and columns. The pressure drop from in-line rows and columns would be about 20% less than a plate with alternating rows and columns. The dimples or projections are provided on heat transfer surfaces to break up the laminar flow layers in the media flowing across the heat transfer surface. This is done to generate a higher film coefficient, i.e., higher performance levels, than would be exhibited by a heat transfer surface without projections such as a flat surface.

While in both FIGS. 1 and 2 the dimples are shown as being located on one side of the plate this is not a limitation. Dimples can be located on both sides of the plate where the dimples and corresponding depressions would alternate between each side of the plate.

Figure 3:
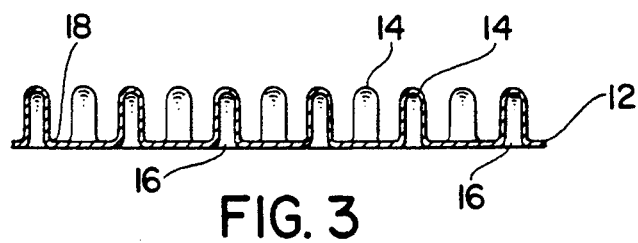
FIG. 3 is a cross-sectional view taken along line 3—3 of the heat transfer surface of FIG. 1.

A cross-sectional view of heat transfer surface 10 of FIG. 1 is shown in FIG. 3. Heat transfer surface 10 includes a plurality of intact dimples 14 and corresponding intact depressions 16. The areas of plate 12 between dimples 14, regions 18, are substantially flat. The vertical surfaces of dimples 14 are preferably substantially perpendicular to the surface of plate 12. While the top of dimple 14 is shown as being rounded it may be of any convenient shape.

Figure 4A:
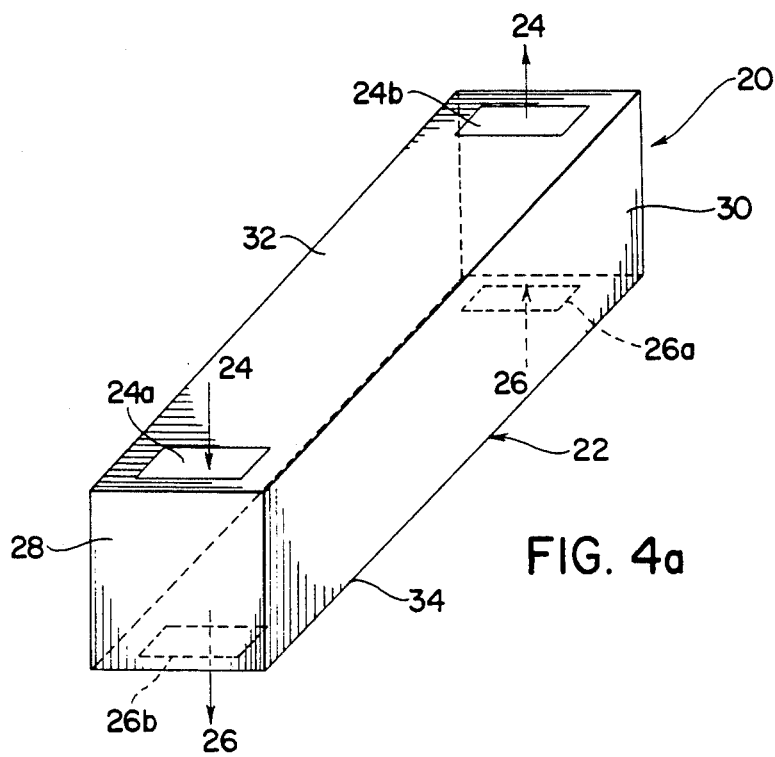
FIG. 4a is a perspective view of an air-to-air heat exchanger.

A perspective view of air-to-air heat exchanger 20 according to this invention, FIG. 4a includes housing 22 with ends 28, sides 30, top 32, and bottom 34. Located inside heat exchanger 20 and not shown is a metal plate with a plurality of folds thereby creating a plurality of channels for either hot fluid 24 or cool fluid 26. Hot fluid 24 enters the heat exchanger through inlet 24a and exits through outlet 24b. Similarly the cool fluid enters the heat exchanger through inlet 26a and exits through inlet 26b.

As hot fluid 24 passes through the exchanger 20, heat energy is transferred to cool fluid 26. The air-to-air heat exchanger illustrated is a single pass counterflow heat exchanger because the hot and cool fluids are traveling in opposite directions through the heat exchanger. However, this is not a limitation of the invention, as the hot and cool fluids can also flow in the same direction through the heat exchanger, or make multiple passes.

Figure 4B:
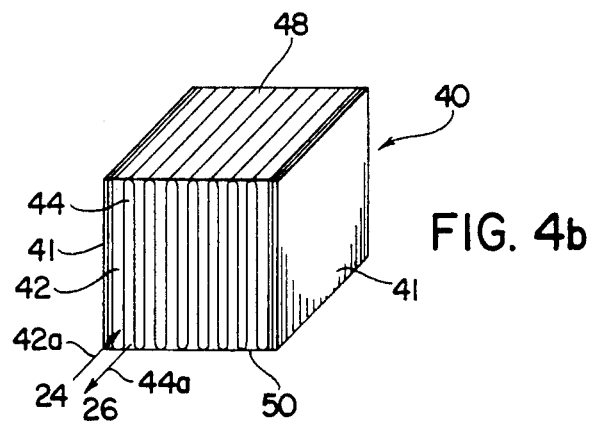

FIG. 4b illustrates an axonometric view of a cross-section of heat transfer section 40 within air-to-air heat exchanger 20 using the heat transfer surface 46 of this invention. In a preferred embodiment, heat transfer section 40 is constructed from a single metal plate which has a plurality of folds to form a plurality of hot fluid passages 42 and cool fluid passages 44. Hot fluid 24 flows through hot fluid passage 42 in direction 42a and cool fluid 26 in opposite direction 44a. Side support plates 41 may be provided to support heat transfer section 40 along sides 30 of the heat exchanger. Top surface 48 and bottom surface 50 of heat transfer section 40 are sealed to prevent mixing of hot and cool fluid between passages 42 and 44. Sealing may be accomplished by means of separate plates traversing and engaging the top and bottom surfaces or by utilizing top 32 and bottom 34 of the heat exchanger. Similarly, the ends of passages 42 and 44 are sealed to prevent the mixing of hot and cool fluids. This may be accomplished by any of a number of known methods including using ends 28 of the heat exchanger.

Figure 4C:
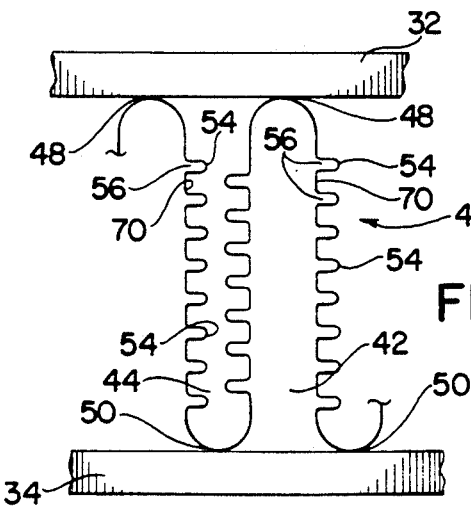
FIG. 4c is a detailed cross sectional schematic view of a portion of the air-to-air heat exchanger of FIG. 4b.

A detailed cross-sectional view of a portion of the heat transfer section 40 of FIG. 4b, is illustrated in FIG. 4c. In this cross-sectional view one hot fluid passage 42 and one cool fluid passage 44 is illustrated. Top surface 48 and bottom surface 50 of the heat transfer section are sealed by top 32 and bottom 34 respectfully of the heat exchanger housing. Prime heat transfer surface 46 of heat transfer section 40 includes a plurality of dimples 54 and depressions 56.

These dimples and depressions are formed integrally with the plate from which heat transfer section 40 is constructed. The area between these dimples and depressions, region 70, is substantially flat. In a preferred embodiment dimples 54 project into cool fluid passage 44 and depressions 56 are within hot fluid passage 42. Alternatively, the dimples can project into the hot fluid passage and the depressions can be in the cool fluid passages. Also, while FIG. 4c illustrates that dimples 54 project into the cool fluid along both surfaces of the two adjoining hot fluid passages, this is not a limitation; dimples may be located on only one surface or on both sides of a plate.

Because depressions 56 are actually within hot fluid passage 42, hot fluid can flow into and out of the depressions. Depressions 56 should accordingly have a size and shape to prevent stagnation of flow within the depressions.

Figure 5:
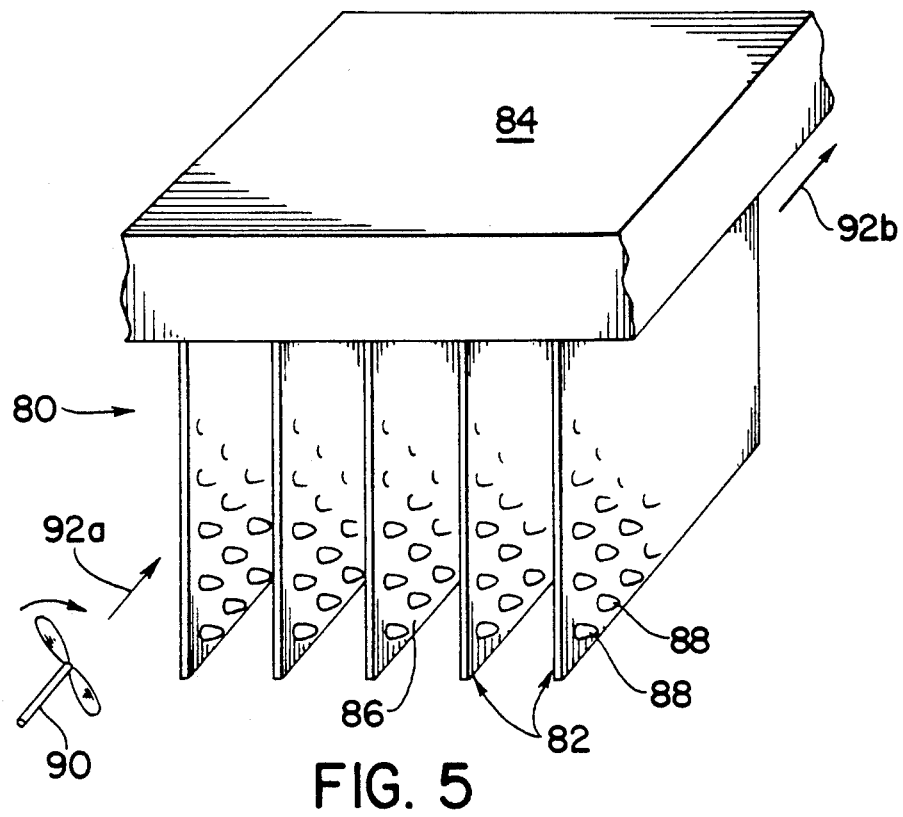
FIG. 5 is an axonometric view of a heat dissipator according to this invention.

A heat dissipator 80 according to this invention is illustrated in FIG. 5. This heat dissipator includes a plurality of fins 82 affixed to hot object 84, that may be an electronic component. The heat transfer surface 86 of fin 82 includes a plurality of intact dimples 88 located on one surface of the plate. Corresponding to each of the dimples, but not shown, is a plurality of intact depressions. In a preferred embodiment, heat energy from object 84 is being dissipated to air flowing along heat transfer surface 86. In this embodiment, fan 90 is used to move air into and through heat dissipator 80 to remove the heat energy from the object. Typically air is introduced into a side of heat dissipator 80 in direction 92a and would exit from the other side as as shown in direction 92b.

Dimples 88 are formed integrally with plate 82 to increase the film coefficient and heat transfer capability of heat transfer surface 86. In addition, the size of the depressions should also be large enough to avoid the stagnation of flow in the depression by the cooling fluid. By preventing the stagnation of flow, heat energy can also be dissipated along the surface formed by the depression.

Figure 6:
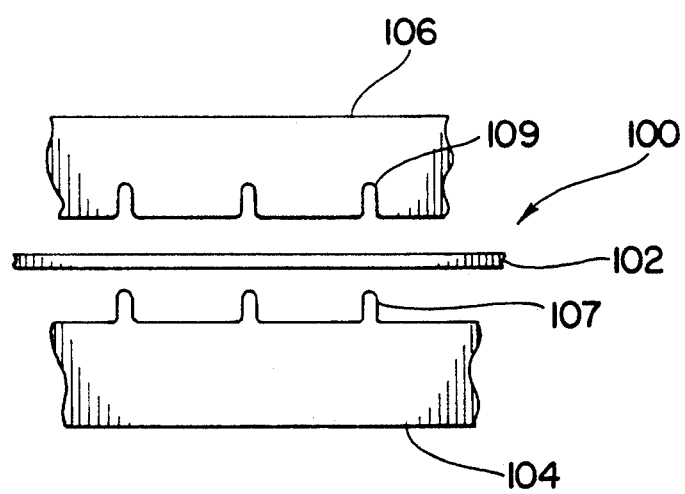
FIG. 6 is a side view of a die assembly for making heat transfer surfaces according to this invention.

A heat transfer surface according to this invention can be made using die assembly 100, FIG. 6, having confronting dies 104, 106. Die 104 contains a number of raised regions 107 that correspond to the spacing, alignment, height and width for the dimples which are to be formed into metal plate 102 located between confronting dies 104 and 106. Located on die 106 and aligned with raised regions 107 are a plurality of depressions 109. A plurality of intact dimples and depressions can be formed integrally in plate 102 by urging confronting dies 104 and 106 against each other. The raised regions may be aligned so that the intact dimples and depressions form a plurality of spaced in-line rows or alternating rows in columns.

Although specific features of the invention are shown in some drawings and not others, this is for convenience only as each feature may be combined with any or all of the other features in accordance with the invention.

Other embodiments will occur to those skilled in the art and are within the following claims:

What is claimed is:

1. An improved heat exchanger for transferring heat energy from a first fluid to a second fluid comprising: a housing including vertically opposed spaced top and bottom surfaces and a plurality of plates having generally planar opposed first and second sides disposed between said surfaces, said plates laterally separated from each other and laterally oriented with respect to said top and bottom surfaces so as to form a plurality of separate side-by-side passages such that said first fluid can flow along the first side of each of said plates and the second fluid along the other opposed second side of each of said plates, said plates each having a plurality of intact spaced first depressions on said first side of each plate which in turn form a plurality of intact first projections on said second side of each said plate, both said depressions and said projections of each said plate extending towards but materially spaced from the planar sides and the projections and/or depressions of those plates adjacent thereto.

2. The improved heat exchanger as set forth in claim 1 including a plurality of intact spaced second depressions on second side interspersed between said first intact projections thereby creating a plurality of intact second projections on said first side located between said second depressions.

3. The improved heat exchanger of claim 1 wherein said depressions and said projections extend towards the respective adjacent plates.

4. The improved heat exchanger of claim 2 wherein said depressions and said projections extend towards the respective adjacent plates.

5. The improved heat exchanger of claim 3 wherein said plates are in the form of a continuous undulated material web interposed between said spaced top and bottom surfaces.

6. The improved heat exchanger of claim 4 wherein said plates are in the form of a continuous undulated material web interposed between said spaced top and bottom surfaces.

* * * * *